United States Patent [19]

O'Brien

[11] 3,974,336

[45] Aug. 10, 1976

[54] SPEECH PROCESSING SYSTEM

[75] Inventor: Edward M. O'Brien, Story City, Iowa

[73] Assignee: Iowa State University Research Foundation, Inc., Ames, Iowa

[22] Filed: May 27, 1975

[21] Appl. No.: 581,164

[52] U.S. Cl. .......................... 179/1 SA; 179/1.5 R; 179/1 VL
[51] Int. Cl.² ......................................... H03G 3/26
[58] Field of Search ........................ 179/1 SA, 1 P; 325/38 B, 42

[56] References Cited
UNITED STATES PATENTS

| | | | |
|---|---|---|---|
| 3,766,542 | 10/1973 | Tomozawa | 325/38 B |
| 3,855,555 | 12/1974 | Buckhard | 325/42 |
| 3,857,111 | 12/1974 | Deschenes | 325/38 B |
| 3,902,123 | 8/1975 | Domer | 179/1 P |

Primary Examiner—Kathleen H. Claffy
Assistant Examiner—E. S. Matt Kemeny
Attorney, Agent, or Firm—Dawson, Tilton, Fallon & Lungmus

[57] ABSTRACT

A system of removing quantizing noise signals between words of an infinite-clipping speech system is disclosed.

Speech signals are quantized in amplitude and in time without substantial loss of intelligibility. The speech signal and a square-wave squelch signal of relatively high frequency are added together, and the sum is amplified, clipped and quantized in time. Timing information from the quantized signal is used to detect the presence of the squelch signal. This information, together with the quantized signal is fed to a tri-level signal generator which generates a high output signal level when the speech signal is high, a low output signal level when the speech signal is low, and a zero level signal when the squelch signal is present, thereby removing all noise signals between words.

5 Claims, 3 Drawing Figures

SPEECH PROCESSING SYSTEM

BACKGROUND AND SUMMARY

The present invention relates to a system for processing human speech. It may be used either as a research aid, for example in intelligibility testing, or it may be used as a speech processor for converting human speech to a more efficient (that is, less redundant) form prior to transmission. When human speech is processed according to the present invention, the resulting signal is a tri-level signal having the advantages of pulse-code-modulated signals for transmission. Yet, there is little loss of intelligibility. The resulting signal is quantized in amplitude and time, and all noise and squelching signal is removed between words. In this sense a "word" is a distinct utterance.

In the 1940's it was found that speech distorted in amplitude by peak clipping was still intelligible, though the quality suffered. In addition, intelligible speech could still be obtained under the worst case amplitude distortion—i.e., infinite peak clipping. Infinite peak clipping of speech is obtained by amplifying the speech signal with an infinite gain amplifier and then clipping the signal to a finite level. The speech signal is thus quantized to one of two levels depending on whether the speech signal is above or below zero. Speech processed in this manner is simplified since only "zero crossing" information is preserved.

Infinitely clipped speech can be simplified even further by quantizing it in time. In 1950 it was found that infinitely clipped speech which was allowed to change levels only at discrete time intervals was still highly intelligible provided the quantizing rate (the inverse of the time interval) was great enough.

The importance and usefulness of amplitude-dichotomized and time-quantized human speech is due both to its waveform and to the simplification it affords to speech signals. The resulting waveform is a digital signal and therefore all the benefits of modern and inexpensive digital electronics can be used for further processing or transmission. For example, correlation analysis is very easy, requiring only logical AND functions and counting. Also, the signal is exactly like binary pulse code modulation (PCM) with just two levels of quantization. Therefore it has the same benefits as binary PCM when used in a communication system.

The simplification of speech resulting from time and amplitude-quantization is due to the reduction of redundancy. This implies that the channel capacity of any system used to send speech signals can also be reduced. It also facilitates the study of those speech parameters necessary for intelligibility.

Licklider and Pollack, two well-known researchers in the field, found that unlike normal speech, infinitely clipped speech does not have intervals of quiet between the words, but exhibited a noise. The effects of this noise, though, did not impair the intelligibility of the speech and was soon masked out by the listeners. They indicated that some "squelch" system should be added in any practical application.

Licklider (1950) showed that speech which was not only amplitude quantized (i.e., infinitely peaked clipped), but also quantized in time was still highly intelligible. The time-quantization was done by allowing the infinitely clipped speech waveform to switch states at the end of the specified time interval according to one of the following rules: Rule A, the output could switch if the input clipped waveform had switched one or more times; Rule B, the output could switch only if the input waveform had switched an odd number of times in the interval. If there are one or more complete pulses (i.e., a return to the start level) in the time interval, Rule A will require the output to switch, while Rule B will require the output to remain unchanged. Rule B may be implemented by a level comparator circuit.

In this experiment, Licklider prefiltered the speech with a first-order, high-pass network before clipping to improve intelligibility. He also postfiltered the time-quantized and clipped speech with a first-order low-pass filter to improve the quality. He found that for optimal results, with the time-quantized clipped speech, both filters should have their break points at 1600 Hz.

The results of varying the quantizing rate showed that quantizing the clipped speech by Rule B produced more intelligible speech at a lower quantizing rate than by using Rule A. Using Rule B, quantization about 8000 intervals/sec. yielded articulation scores from 90% to 95%. If the speech was quantized at 4000 intervals/sec. (this would be equivalent to a sampling frequency of 4000 Hz), the intelligibility for Rule B was 50% and for Rule A 27%. At 6000 intervals/sec. Rule B yielded 75% intelligible speech and Rule A 60%. The circuit that produced Rule A quantization was inoperable about 8000 intervals/sec.

Licklider qualified these results saying that the processed speech sounded much worse than the intelligibility scores indicated, due in part to the noise between words, and that extensive training of the listeners was needed before the above results were achieved.

Ainsworth (1967) processed infinitely clipped speech such that at the zero crossings of the waveforms a 10 microsecond pulse of either positive or negative value was generated. The infinite peak clipping network consisted of "three peak clipping amplifiers (of about 20 dB amplification each) followed by a Schmitt trigger." The pulses were integrated before being heard by the listeners. He found that infinitely clipped speech and differentiated-clipped speech had 90 to 100% word intelligibility as Licklider and Pollack had found.

Thomas (1968) studied the influence of the first and second formants on the intelligibility of speech. Thomas found that all speech formants are not equally important. He band-pass filtered speech such that only the first formant frequencies, a band centered around 500 Hz, were left in the spectrograms. The word articulation score after infinite peak clipping was 7.6%. When only the second formant range of frequencies, centered around 1500 Hz, were left (along with residual third formant components) the average word intelligibility after clipping the filtered speech was 71% with a high of 92% by an experienced listener. The center frequencies of the two band-pass filters were experimentally set for the one speaker who generated the word lists.

Thomas, in his experiment, also added a squelch system which consisted of a 20,000 Hz oscillator and a summing system. The inaudible 20,000 Hz signal was added to the filtered speech signal and its level increased until there was relative quiet between the words. The amplitude of the 20,000 Hz signal was kept small enough so as not to cause appreciable center clipping distortion.

As mentioned, some type of squelching circuit is desirable to mask the noise between words. Thomas added a 20,000 Hz sine wave to the speech signal before the clipping stage. In this system, whenever the signal amplitude falls within the peak-to-peak amplitude of the 20,000 Hz squelch signal, the output of the clipper is an inaudible 20,000 Hz square wave. The amplitude of the squelch is adjusted to be equal to the amplitude of the noise between words. The squelch signal also affects the speech itself, but 0 to 2 dB of center clipping can be tolerated with no effect upon the speech intelligibility.

The squelch system for infinitely clipped speech that is also time-quantized is not as simple as the system just mentioned. For any given quantizing rate the highest frequency square wave obtainable on the output will be one-half the quantizing rate or frequency (two level changes are necessary for a complete output cycle). For example, if the quantizing rate is set at 10,000 intervals/sec. then the highest frequency square wave possible at the output of the quantizer is 5,000 Hz.

Due to the sampling of the waveform by the quantizing process, any type of frequency squelch system will yield a squelch signal on the output whose frequency will be between zero and one-half the quantizing rate. The exact frequency will depend upon the ratio of the squelch to the quantizing frequency. Thus if the quantizing rate is less than 40,000 Hz, then the squelch signal will always be between 0 Hz and 20,000 Hz no matter what the initial squelch frequency was. If it lies between the extremes of this range it will be audible.

While a constant tone masking the noise between words is probably more desirable than random noise, the present invention provides for no sound between the words. A tri-level or ternary signal is generated from the binary signal which consists of the infinitely clipped and time-quantized speech and a constant frequency square wave masking the noise between the speech words. The positive value and negative values of the tri-level signal indicate respectively that the signal level is greater than the peak positive level of the squelch signal and that it is below the peak negative level of the squelch signal. The zero level of the tri-level signal indicates that the speech signal has a value within the peak-to-peak range of the squelch signal.

It is desirable to have the squelch frequency as high as possible so as not to obscure any high frequency information in the signal. The squelch frequency is set to be exactly one-half the quantizing rate and synchronous with it.

The present invention thus provides for a speech processor which quantizes a speech signal in amplitude and in time to produce a tri-level signal having the characteristics that when the speech signal level is greater than the positive squelch level, the output will be a positive level. When the speech signal level is beneath the maximum negative level of the squelch signal, the output signal will be a negative level, and when the squelch signal exceeds the speech signal, the output signal will be at a zero level. Other features and advantages of the present invention will be apparent to persons skilled in the art from the following detailed description of a preferred embodiment accompanied by the attached drawing.

THE DRAWING

DETAILED DESCRIPTION

Figure 1:
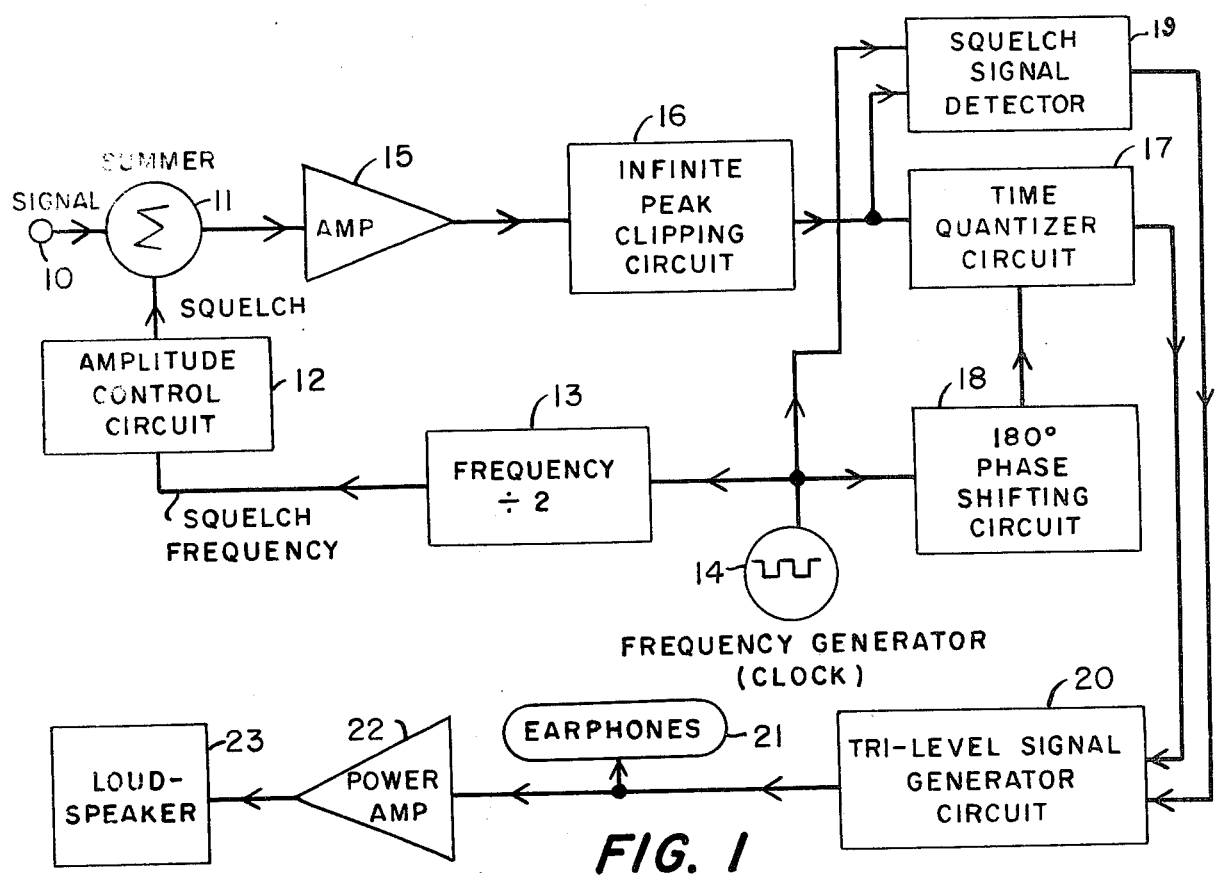
FIG. 1 is a functional block diagram of a speech processing system incorporating the present invention and adapted for the study of quantized speech.

Referring first to FIG. 1, an input signal representative of speech is fed to the system via terminal 10, and it is coupled to a summing circuit 11. The other input of the summing circuit 11 is received through an amplitude control circuit 12 from a "Divide by Two" circuit 13. The input to the "Divide by Two" circuit 13 is the output of a clock pulse generator 14 which generates a symmetrical square wave. Hence, the "Divide by Two" circuit 13 may be a flip-flop or bistable circuit. The output signal of the Divide by Two circuit 13 is similar to the output signal of the clock generator 14, but of one-half the frequency of the clock signal. This output signal provides the squelch signal, which, as mentioned, is fed to the summing circuit 11 where it is algebraically added with the input speech signal, the sum then being fed to an amplifier circuit 15.

The amplitude of this squelch signal is adjusted to be slightly greater than the noise between words so as to mask the noise. For example, if the peak-to-peak voltage of the input speech signal is 1.0 volts, then the amplitude of the square-wave squelch signal may be of the order of 100–250 millivolts. The magnitude of the squelch signal depends upon the background noise present in the speech signal, but in general the amplitude of the squelch signal will fall in the range of 10% – 25% of the peak-to-peak voltage of the speech signal for ordinary background noises. It will be recalled that the speech signal will ultimately be amplified and clipped, and it will be appreciated that the noise will thereby also be amplified.

The output of the amplifier 15 is fed to an infinite peak clipping circuit 16 which generates a binary output signal. That is, the output of the clipper circuit 16 will be "HIGH" if the combined input speech signal plus the squelch voltage is above zero volts, and it will be correspondingly "LOW" if the combined input speech signal plus the squelch voltage is below zero volts. If commercially available transistor-transistor logic circuits are used, the output levels of the infinite peak clipping circuit 16 may be +5 volts and 0 volts respectively. It is the infinite peak clipping circuit 16 which quantizes the input speech signal in amplitude; and its output is fed to a time-quantizer circuit 17.

As will be more fully explained below, the peak clipping circuit may include a comparator circuit and the time quantizer may include a J-K flip-flop circuit. The J-K flip-flop is clocked by the inverted output signal of the clock generator 14—that is, so the output signal of the clock pulse generator 14 is shifted in phase by 180°. The J-K flip-flop in the time-quantizer circuit 17 allows the change of a signal level only at predetermined, periodic times which are defined by the clock pulse generator 14. The time-quantization which is employed corresponds to Licklider's Rule B quantization as discussed above. The phase shifting circuit 18 is used to avoid timing problems between the squelch signal and the time-quantizer circuit 17.

A squelch signal detector circuit 19 receives timing information from the clock pulse generator 14 and from the output of the comparator circuit in the clipping stage; and from these two signals it determines whether or not a squelch signal is present, as distinguished from a speech signal. Briefly, the squelch signal detector 19 samples and stores three successive time-quantized signals, and if it determines that the polarity of this signal has changed twice in succession, the presence of the squelch signal is indicated. The squelch signal, of course, is at the higher frequency portion of the spectrum of the signal being processed.

The output signal of the time-quantizer circuit 17 is fed to a tri-level signal generator circuit 20 which also receives the output signal of the squelch signal detector 19. The tri-level signal generator circuit 20 generates an output signal having one of three possible states or levels as defined above. In other words, the output signal of the tri-level signal generator circuit 20 is at zero volts when a squelch signal is detected by the squelch signal detector 19. When the speech signal level is greater than the peak positive level of the squelch signal, the output of the tri-level signal generator circuit 20 will be a positive level. When the negative level of the speech signal is greater than the peak negative level of the squelch signal, the output of the tri-level signal generator 20 will be a negative level. Further, the positive output level of the generator circuit 20 is equal, in absolute value, to the negative output level—that is, if the positive output level is +2.5 volts, then the negative output level is −2.5 volts.

In the case of the illustrated embodiment which, as mentioned, is intended for use as an instrument in speech studying, the output of the tri-level signal generator circuit 20 may be coupled to earphones 21 and through a power amplifier 22 to a loud-speaker 23. The loud-speaker allows as many listeners as desired to take speech intelligibility tests at the same time and under the same circuit conditions. The earphones may be used by the equipment operator when the electronic equipment is remote from the listeners' environment. The tri-level signal itself is, of course, useful, and may be transmitted through a communication system or processed and then transmitted.

Figure 2:
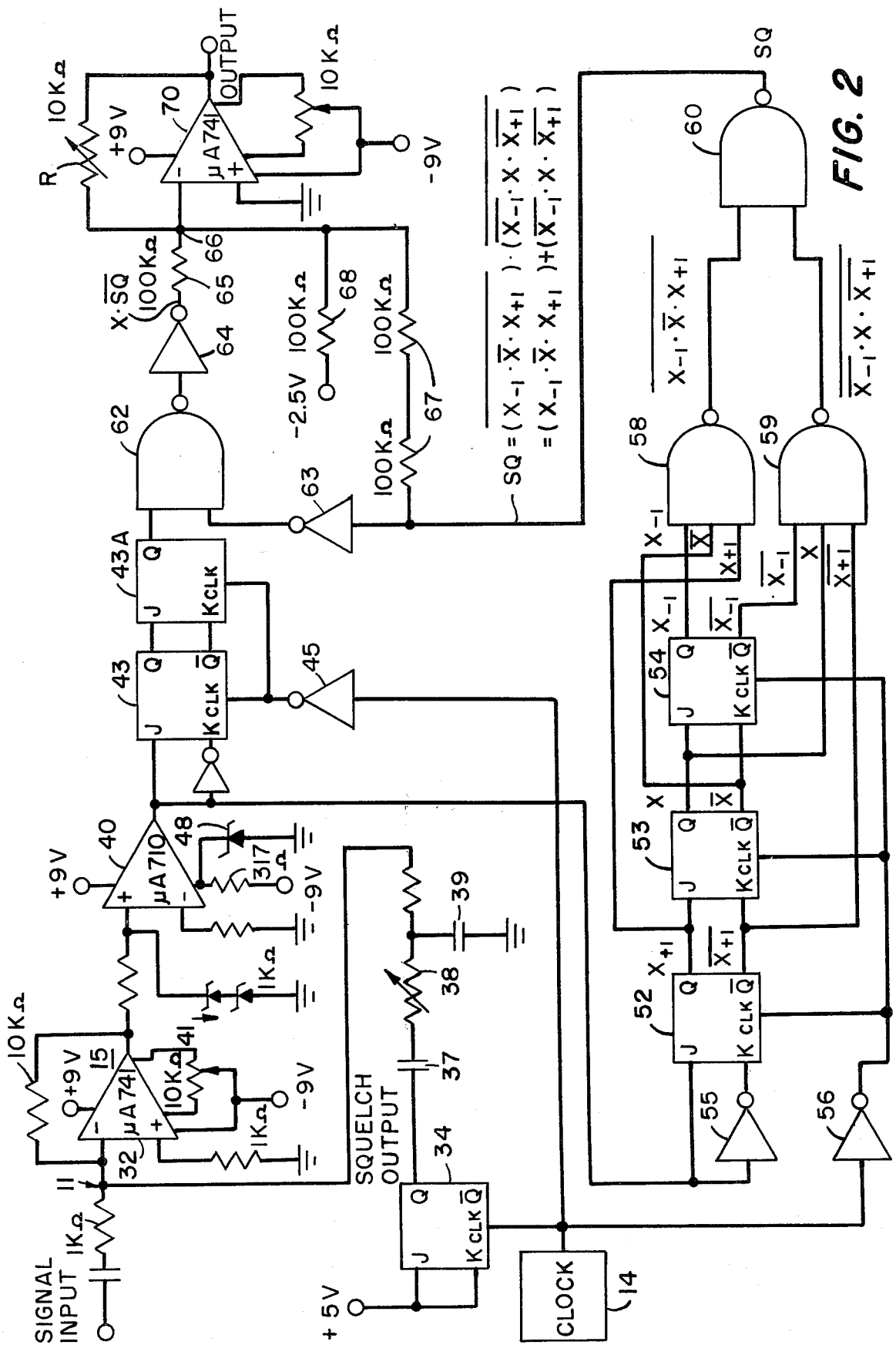
FIG. 2 is a detailed circuit schematic diagram, partially in functional block form, of the signal processing portion of the system of FIG. 1.

Turning now to FIG. 2, the input speech signal is fed through the input terminal 10, a blocking capacitor 30 and a resistor 31 to the summing junction 11 which is directly connected to the input terminal of an operational amplifier 32 operating in an inverting mode. The operational amplifier 32 provides the primary active element of the amplifier stage 15 of the block diagram of FIG. 1. The operational amplifier 32 operates as a linear inverting amplifier with a closed-loop gain of 10. Amplifiers of this type are commercially available, and one that has been successfully used has a slew rate of 0.5 volts per microsecond, and a bandwidth of 100 KHz.

The other input to the summing junction 11 is the squelch signal, and it is derived from the output of a clock pulse generator 14 which is fed to the clock input of a J-K flip-flop 34. Both inputs to the flip-flop 34 are connected to a positive signal level so that the Q output changes its output binary stage or "toggles" upon reception of each negative-going signal at the clock input. Hence, the output signal of the flip-flop 34 is a symmetrical square wave having a rate or frequency equal to one-half the clock rate. The clock signal, squelch signal and inverted clock signal are shown respectively on lines L1, L2 and L3 of FIG. 3.

In the present system, the speech signal is quantized at the clock rate, as will be discussed. For any given quantizing rate, the highest frequency square wave obtainable at the output is one-half the quantizing rate or frequency since there must be two level changes for a complete output cycle. For example, if the quantizing rate (that is, the rate at which the input speech signal can be compared with the magnitude of a squelch signal) is set at 20,000 intervals per second, then the highest frequency square wave possible at the output of the quantizer is 10,000 Hz.

Figure 3:
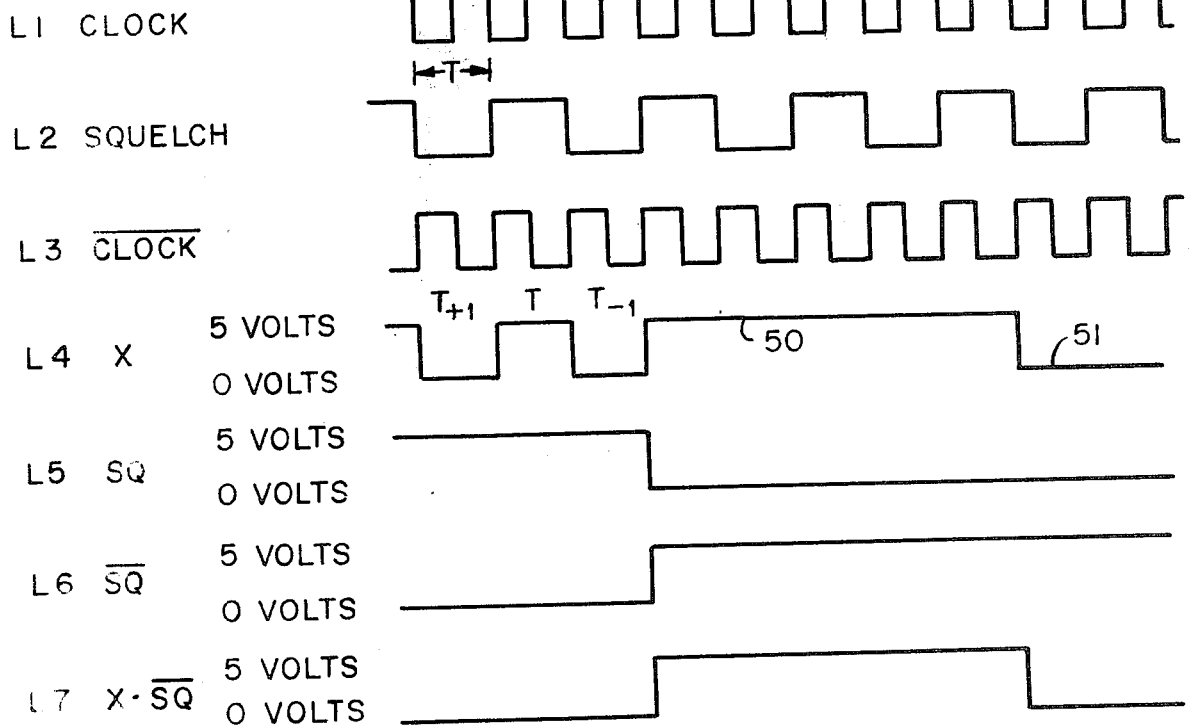
FIG. 3 is a timing diagram illustrating certain of the voltages in the circuitry of FIG. 2, shown in idealized waveforms.

In the present system, the squelch signal frequency is equal to one-half the quantizing rate, and as seen from FIG. 3, it is synchronous with it (compare lines L1 and L2).

The squelch signal is also coupled through a blocking capacitor 37 and a variable resistor 38 before being applied to the summing junction 11. Further, a capacitor 39 is used to reduce the rise time of the squelch signal so that the output of the following operational amplifier does not ring.

As indicated above, the squelch signal is derived from a J-K flip-flop, of the type known in the art. Such flip-flops include an input section (sometimes referred to as the "master" stage) and an output section (sometimes referred to as the "slave" stage). Signals applied to the master section of the flip-flop are not transmitted to the output or slave section except during the present of a change in the clock level (in the present case, a negative-going signal).

The output of the amplifier 32 is coupled to the input of a differential comparator circuit 40. The input signal is limited in amplitude by means of a pair of Zener diodes connected back-to-back and generally designated by reference numeral 41.

The output of the comparator 40 is a positive voltage level (a nominal 5 volts, for example), when the voltage difference between the plus and minus input terminals is more than 1 mv., and it is zero volts when the difference between the voltage at the input terminals is less than −1 mv. Between these two input values, the output is linearly related to the input with a maximum gain of 1,000. A Zener diode 48 provides the negative supply voltage at the required level for the amplifier 40.

Additional gain is provided by a pair of J-K flip-flops 43, 43A. The J input of flip-flop 43 is connected directly to the output of the amplifier 40, and its K input is connected to the output of the amplifier 40 through an inverter circuit 44. Thus, only a binary signal can exist at the output of the flip-flop 43. The clock input of the flip-flops 43, 43A is received through an inverter 45 from the clock pulse generator 14. The inverted clock signal is shown on line L3 of FIG. 3.

It will be observed that by using a comparator circuit 40, the output signal level goes HIGH or LOW, using zero volts as the actual reference. Further, there is no hysteresis associated with a comparator circuit as is found, for example, in a Schmitt trigger circuit in which the output does not go HIGH until the input voltage exceeds a predetermined positive threshold, and goes LOW when the input exceeds a negative threshold. It may also be observed that the output signal of the flip-flop circuit 43 is a true binary signal which, if the preceding circuitry of the type most commonly commercially available, may either be a positive level or zero volts—that is, it is not symmetrical with respect to ground or zero volts. This output signal is $X_{+1}$, and the output signal of flip-flop 443A is X since it is delayed one clock period. In this nomenclature, the subscript denotes relative time in terms of clock pulse occurrences.

Because of the double-side input gating to the quantizing flip-flops 43 and 43A, they respond as normal flip-flops in the sense that whatever signal is presented to the J input just prior to the negative-going edge of a clock signal will be shifted to the output and stored there by the clock. During the high portion of the clock signal, the master and slave sections of the flip-flop are disconnected and input information is gated in to set the master section of the flip-flop. During the low portion of the clock signal, the inputs to the master section are disabled and the information already there is gated into the slave or output section. If both inputs are 0, then the information at the output remains the same after the occurrence of the negative-going clock level. If both inputs are 1, then the output signals are inverted by the negative-going clock signal.

It will thus be appreciated that the output of the flip-flop 43 is identical to the output of the comparator 40 (and the output of flip-flop 43A is the same signal delayed one clock pulse), except that the output of the flip-flop 43 can change only with the occurrence of the negative-going edge of the clock. The speech signal which has already been infinitely clipped at this point is thus quantized at a rate equal to and in synchornism with the clock rate.

Referring now to line L4 of FIG. 3, and comparing it with the clock pulse in line L1, it will be seen that quantizing rate is equal to the clock rate. This means that the quantized signal shown in line L4 may change level once for each clock period. The squelch frequency has been selected to be equal one-half the quantizing rate or clock frequency, as illustrated in line L2 of FIG. 3. The presence of the squelch signal, as distinguished from the speech signal is detected by the circuitry at the lower portion of FIG. 2. Briefly, the presence of a squelch signal is determined by comparing the logic level of the combined signal at any given time with the logic levels of that signal in the next preceding clock interval and also in the next succeeding clock interval. These two clock intervals are sometimes referred to as the "adjacent" clock intervals. If the signal in the two adjacent levels is opposite to the signal level in the present interval, the system is operating at its highest possible frequency, and this is taken as an indication of the presence of the squelch signal. In other words, referring to the first portion of the signal on line L4 of FIG. 3, the signal is at a possible level during the clock period T, and it is at a negative level in the next preceding clock period, $T_{-1}$, and the next succeeding clock interval, $T_{+1}$. Hence, it is determined that the squelch frequency, not the speech frequency is present. If the signal remains at its high level for more than one clock period, as indicated by the portion of the waveform in line L4 designated by numeral 50, it means that the speech signal is above the squelch threshold. If, on the other hand, the signal remains at a negative level for more than one clock period, as indicated at 51, then the speech signal is below the negative squelch level or threshold.

The squelch-detecting circuitry includes a shift register comprising three J-K flip-flops, 52, 53 and 54 connected to operate as a shift register. The input signal to the first flip-flop 52 is the output signal of the comparator circuit 40; and again, double-side gating is employed by using an inverter circuit 55 feeding the input signal to the K input. The clock signal to the shift register is fed from the clock pulse generator 14 through an inverter circuit 56. Hence, the clock signal is the inverted clock shown in line L3 of FIG. 3.

If the past, present and future states of the signal (denoted X) are known, then it is possible to determine whether the signal at any given clock interval is part of a squelch signal. If the value of the signal in the next preceding clock interval is denoted $X_{-1}$, the value of the signal in the present clock interval by X, and the value of the signal at the next succeeding interval as $X_{+1}$, then the Boolean algebraic equation indicating the presence of a squelch signal is as follows:

$$SQ = X_{-1} \cdot \overline{X} \cdot X_{+1} + \overline{X_{-1}} \cdot X \cdot \overline{X_{+1}} \qquad \text{Eq. 1}$$

Returning now to the circuitry of FIG. 2, it will be observed that the flip-flop 53 stores the value of the signal X at the clock interval of interest, the flip-flop 52 stores the value of X at the next succeeding clock interval ($X_{+1}$) and flip-flop 54 stores the value of the signal at the next preceding clock interval ($X_{-1}$). The following signals are fed to the inputs of a three-input NAND gate 58: $X_{-1}$, $\overline{X}$, and $X_{+1}$. The following signals are fed to the inputs of a second three-input NAND gate 59: $\overline{X_{-1}}$, X, and $\overline{X_{+1}}$. The function values of the two NAND gates 58, 59 are indicated in FIG. 3. Briefly, these functions are the inverse functions of the two sets of conditions which indicate successive changes in signal value for three clock intervals, thereby indicating the presence of the squelch signal. These two signals are fed to the inputs of a two-input NAND gate 60, the resulting function of which is also indicated in the drawing, and defines the presence of a squelch signal. The output of the NAND gate 60 is thus the output of the squelch signal detector 19 of FIG. 1.

Turning now to the upper right-hand portion of the circuitry of FIG. 2, there is shown the tri-level signal generator. This circuitry includes a NAND gate 62 receiving, as one output, the output of the time-quantizing flip-flop 43A The other output of the NAND gate 62 is received through an inverter 63 from the squelch detector. The output of the NAND gate 62 is fed through an inverter 64 whose output is thus representative of the quantity $X \cdot \overline{SQ}$. The output of the NAND gate 64 is coupled through a resistor to a summing junction 66. The squelch signal, SQ is also fed through a resistor 67 to the summing junction 66. Finally, a negative signal level (for example, minus 2.5 volts) is also fed through a resistor 68 to the summing junction 66.

The summing junction 66 is connected to the negative signal terminal of an operational amplifier 70, the output of which is the tri-level signal discussed above.

The operational amplifier 70 acts as a summing amplifier for the analog voltage levels of the logic signal. It will be recalled that the logic levels are plus five volts and zero volts. The output equation is as follows, where R represents the specific resistance on the feedback resistor denoted R in the drawing:

$$V_{out} = -\left[\frac{R}{100K\Omega}V_{x.\overline{sq}} + \frac{R}{200K\Omega}V_{sq} - \frac{R}{100K\Omega}2.5\right] \text{ volts}$$

Setting the gain, G, of amplifier 70 as $$G = \frac{-R}{100K\Omega},$$

then $$V_{out} = G\left[V_{x.\overline{sq}} + \frac{V_{SQ}}{2} - 2.5\right] \text{ volts} \qquad \text{Eq. 2}$$

If the input signal is a high signal (5 volts), then the squelch signal is not present, so the output of inverter 63 is a 1. The output of inverter 64 will also be a 1, or 5 volts, $V_{x.\overline{sq}} = 5$ volts, $V_{SQ} = 0$ volts, so the output voltage equals G[2.5] volts.

If the input signal is low, it also indicates that the squelch signal is not present, so $V_{x.\overline{sq}} = 0$ volts, $V_{SQ} = 0$ volts, and $V_{out} = G[-2.5]$ volts.

If the signal is detected as being the squelch signal, then $V_{x.\overline{sq}} = 0$ volts, $V_{SQ} = 5$ volts, and $V_{out} = G[0 + 5/2 - 2.5]$ volts = 0 volts.

Another way of looking at the logic of the tri-level signal generator is that if the squelch signal is not present, then no current is fed to the summing junction through resistor 67, and the actual signal level is gated through the NAND gate 62 to the summing junction through resistor 65. The value of resistor 65 is equal to the value of resistor 68, but the resistor 67 is twice the value of resistors 65, 68. Hence, the fixed signal (−2.5 volts) will be subtracted from the actual signal in the absence of a squelch signal, and the signal at the summing junction will therefore either be +2.5 volts or −2.5 volts, depending upon whether the input signal is respectively 5.0 volts or 0 volts. If the squelch signal is present, then the gate 62 is inhibited and the −2.5 volt signal is subtracted from the squelch signal divided by 2, resulting in a zero input signal at the summing junction 66.

It will thus be appreciated that the tri-level signal generator generates an output signal which is positive if the speech signal is HIGH and the squelch signal is not present, which is negative if the speech signal is LOW and there is no squelch signal, and which is zero volts in the presence of a squelch signal.

If it is desired to use the system of FIG. 1, the power amplifier 22 may be of conventional design having an output impedance preferably matched to the apparent impedance of the loudspeaker 23. A push-pull amplifier may be used here in order to amplify signals of both positive and negative polarity.

Having thus described in detail a preferred embodiment of the invention, persons skilled in the art will be able to modify certain of the circuitry which has been illustrated and to substitute equivalent elements for those disclosed while continuing to practice the principle of the invention; and it is, therefore intended that all such modifications and substitutions be covered as they are embraced within the spirit and scope of the appended claims.

I claim:

1. Apparatus for processing an analog speech signal comprising: signal generator means for generating a squelch signal; summing circuit means for generating a summed signal representative of the sum of said speech signal and said squelch signal; circuit means receiving said summed signal for quantizing the same in amplitude and in time; detector circuit means for detecting the presence of said squelch signal in said summed signal; and tri-level signal generator receiving said quantized, summed signal and responsive to said detector circuit means for generating an output signal of a first level when said quantized signal is a speech signal of one level, and for generating an output signal of a second level when said quantized signal is a speech signal of a second level, and for generating an output signal of a third level when said detector circuit means detects the presence of a squelch signal in said summed signal.

2. The apparatus of claim 1 wherein said third level of said output signal is zero volts, and wherein said first and second levels thereof are of opposite polarity but equal in magnitude relative to said zero volt level.

3. The apparatus of claim 1 further comprising a clock pulse generator, said squelch signal generator receiving the output signal of said clock pulse generator and dividing the same by two to generate said squelch signal; and wherein said quantizing circuit means quantizes said summed signal in timed relation to the output signal of said clock pulse generator.

4. In apparatus for processing an analog speech signal to which a squelch signal is added and the summed signal is quantized in amplitude and time, the improvement comprising: squelch signal detector means responsive to said summed signal quantized in amplitude for detecting the presence of a squelch signal; and tri-level signal generator means receiving said quantized signal and responsive to the output signal of said squelch signal detector means for generating a tri-level signal, said tri-level signal being of a first level when said speech signal is greater than said squelch signal, said tri-level signal being a second level when said speech signal is less than the LOW level of said squelch signal, said tri-level signal being a level intermediate said first and second levels when said squelch signal is present.

5. A method of processing a speech signal comprising: adding a binary squelch signal to said speech signal to generate a summed signal, amplifying and clipping the peaks of said summed signal; quantizing said summed signal in timed relation to a clock pulse, said clock pulse bearing a known timed relation with said squelch signal, detecting the presence of a squelch signal in said summed signal; and generating an output tri-level signal having a HIGH value when said speech signal is high, a low level when said speech signal is low, and an intermediate level when said squelch signal is present.

* * * * *